United States Patent
Cook et al.

[11] Patent Number: 5,187,109
[45] Date of Patent: Feb. 16, 1993

[54] LATERAL BIPOLAR TRANSISTOR AND METHOD OF MAKING THE SAME

[75] Inventors: Robert K. Cook; Mario M. A. Pelella, both of Poughkeepsie, N.Y.

[73] Assignee: International Business Machines Corporation, Armonk, N.Y.

[21] Appl. No.: 733,090

[22] Filed: Jul. 19, 1991

[51] Int. Cl.$^5$ .......................................... H01L 21/328
[52] U.S. Cl. ..................................... 437/32; 437/162; 148/DIG. 96
[58] Field of Search ....................... 437/32, 33, 31, 162; 148/DIG. 96, DIG. 123; 357/34, 35

[56] References Cited

U.S. PATENT DOCUMENTS

| | | | |
|---|---|---|---|
| 4,546,536 | 10/1985 | Anantha et al. | 437/46 |
| 4,778,774 | 10/1988 | Blossfeld | 437/31 |
| 4,808,548 | 2/1989 | Thomas et al. | 437/57 |
| 4,824,796 | 4/1989 | Chiu et al. | 437/57 |
| 4,871,685 | 10/1989 | Taka et al. | 437/33 |
| 4,873,199 | 10/1989 | Hunt | 437/31 |
| 4,962,053 | 10/1990 | Spratt et al. | 437/31 |
| 4,978,630 | 12/1990 | Kim | 437/32 |
| 4,981,808 | 1/1991 | Hayes | 437/31 |
| 4,983,531 | 1/1991 | Cosentino | 437/31 |
| 5,061,644 | 10/1991 | Yue et al. | 437/31 |

FOREIGN PATENT DOCUMENTS

| | | | |
|---|---|---|---|
| 1-211969 | 8/1989 | Japan | 437/32 |
| 1-214163 | 8/1989 | Japan | 437/32 |

OTHER PUBLICATIONS

Article by S. P. Gaur et al., entitled "Optimum Lateral PNP Transistor", published in the IBM Technical Disclosure Bulletin, vol. 26, No. 9, Feb., 1984, pp. 4584 and 4585.
Article by S. P. Gaur et al., entitled "Enclosed Lateral PNP Transistor", published in the IBM Technical Disclosure Bulletin, vol. 29, No. 3, Aug., 1986, pp. 1029 and 1030.

*Primary Examiner*—T. N. Quach
*Attorney, Agent, or Firm*—Irwin Ostroff

[57] ABSTRACT

A lateral bipolar transistor and method of making the transistor which is compatible with a method of making MOS transistors to be used in making BICMOS circuits are disclosed. The method includes the following steps: Forming on the surface of a substrate of one conductivity type at least one layer of a semiconductor material of the opposite conductivity type. Forming a first region of the opposite conductivity type into one portion of the layer in one of the portions of the layer and a highly conductive contact region to the layer in another portion, forming a layer of an insulating material over the layer and providing an aperture therethrough to the first region. Depositing a layer of polycrystalline silicon over the insulating layer and in the aperture and defining the polycrystalline silicon layer so that it is in the aperture and extends a short distance beyond the aperture but not beyond the edge of the first region. Ion implanting a dopant of the opposite conductivity type into the defined portion of the polycrystalline silicon and into the portion of the first region which extends beyond the edge of the polycrystalline region to form a second region of the opposite conductivity type in the layer and around the first region. Annealing the substrate to drive the dopant from the conductive layer into the first region to form a third region of the opposite conductivity type in the first region and spaced from the third region.

18 Claims, 3 Drawing Sheets

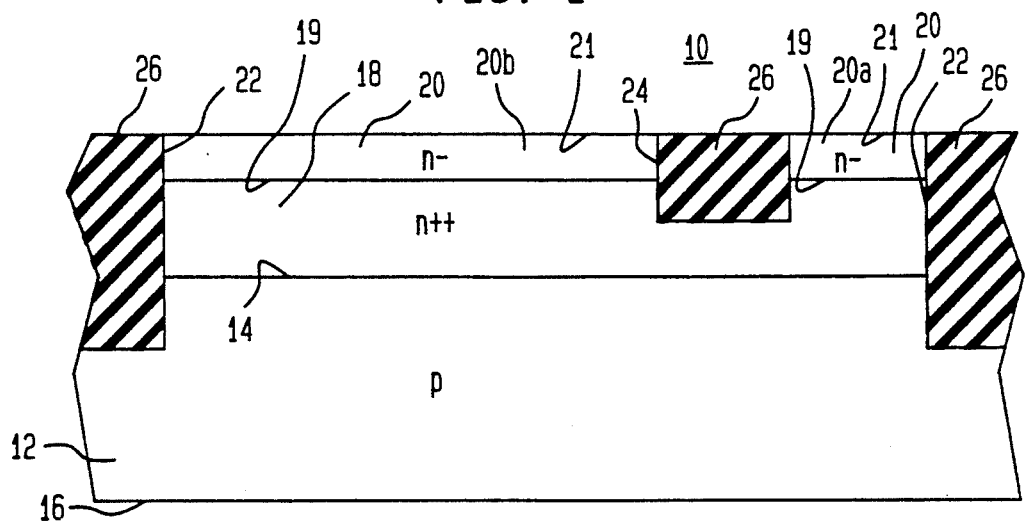
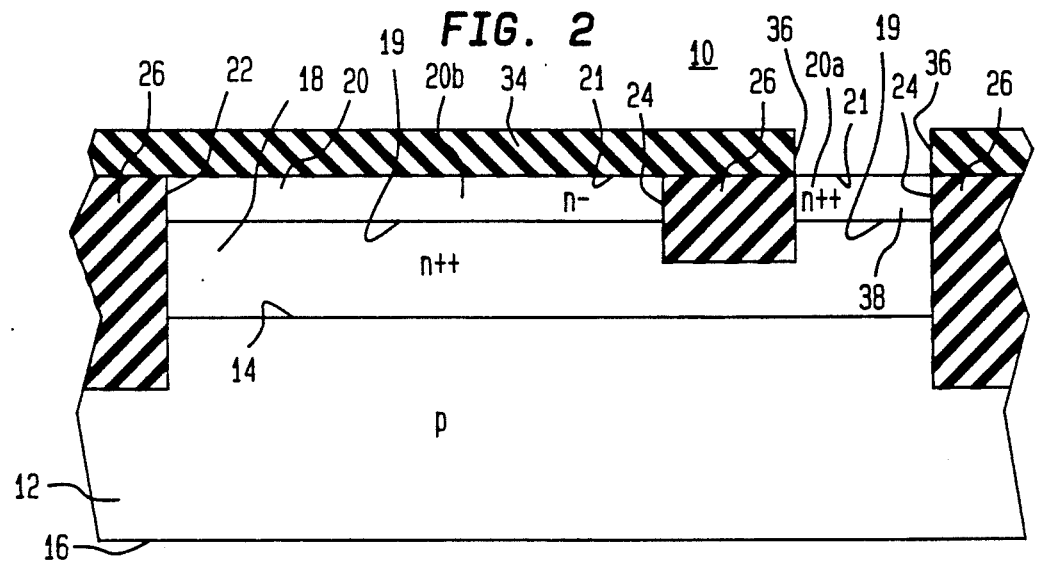
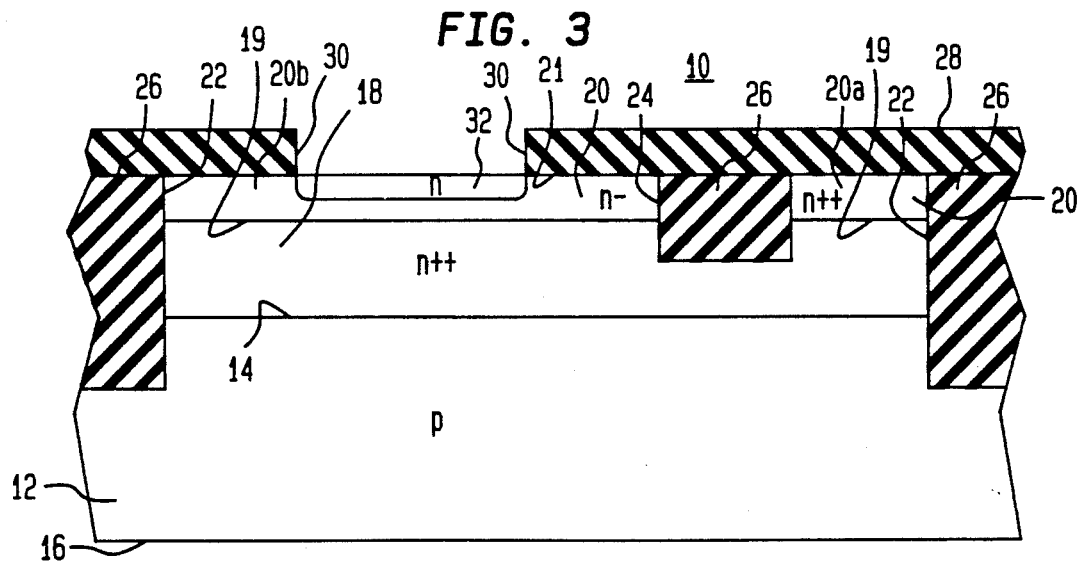

LATERAL BIPOLAR TRANSISTOR AND METHOD OF MAKING THE SAME

FIELD OF THE INVENTION

The present invention relates to a lateral bipolar transistor and method of fabricating the transistor, and, more particularly, to a lateral bipolar transistor and method of making the same which is compatible with fabricating complementary metal-oxide-semiconductor (CMOS) field effect transistors (FETs) so as to facilitate the fabrication on a single semiconductor substrate of bipolar and CMOS transistors to form a combination bipolar and complementary MOS transistor (BICMOS) circuit.

BACKGROUND OF THE INVENTION

Lateral bipolar transistors, in general, comprise three separate semiconductive regions of alternating conductivity types, such as n-p-n or p-n-p, extending along a common surface of a semiconductor substrate so that all of the electrical contacts to the various regions are at the same surface of the substrate. Such lateral bipolar transistors have many applications, particularly in integrated circuits. Bipolar transistors were generally used in analog circuits whereas MOS transistors were generally used in digital circuits. However, there have been circuits developed which require both MOS transistors and bipolar transistors in a single circuit and on a single substrate. These circuits are generally known as BICMOS circuits. To make such BICMOS circuits, it is necessary to have a fabrication process by which both MOS transistors and bipolar transistors can be formed during a common process sequence.

One type of lateral bipolar transistor is shown and described in the article of S. P. Gaur et al., entitled "Optimum Lateral PNP Transistor", published in *IBM Technical Disclosure Bulletin,* Vol. 26, NO. 9, February 1984, pages 4584 and 4585. However, the lateral bipolar transistor described in this article has a number of problems. It includes a double layer polycrystalline silicon contact system with the first level making contact to the base and the collector and the second level making contact to the emitter. This double level system makes the surface topography thicker so that the photolithograhic process used to form the contacts becomes less accurate. Also, the double level system is not compatible with normal MOS processing so that it would be difficult to make this lateral bipolar transistor in a BICMOS device. Also, this lateral bipolar transistor uses a sidewall spacer to define the spacing across the base region between the emitter region and the surrounding collector region. In forming a sidewall spacer, the thickness of such a sidewall spacer can be changed only a very little amount and it's width along the surface of the base region is limited. Therefore, the spacing between the emitter region and the collector region can be varied only a little. Since this spacing controls the beta of the transistor, the beta of this type of lateral bipolar transistor can be varied only over a narrow range and has a maximum value. Thus, the lateral bipolar transistor disclosed in this article is not suitable for use in making some BICMOS integrated circuits and can form transistors having only a limited variation in beta.

Processes have been developed for making BICMOS integrated circuits which include a bipolar transistor and MOS transistors. Some of such processes are disclosed in U.S. Pat. No. 4,808,548 to M. Thomas et al., issued Feb. 28, 1989, and entitled "Method of Making Bipolar and MOS Devices on Same Integrated Circuit Substrate" and in U.S. Pat. No. 4,824,796 to Tzu-Yin Chiu et al., issued Apr. 25, 1989, and entitled "Process for Manufacturing Semiconductor BICMOS Device". However, in the BICMOS circuits of each of these patents the bipolar transistor is a vertical bipolar transistor and not a lateral bipolar transistor.

Therefore, it is desirable to have a method for making bipolar transistors which is compatible with a method for making MOS transistors so as to permit forming BICMOS integrated circuits.

SUMMARY OF THE INVENTION

The present invention is directed toward a lateral bipolar transistor and method of making a lateral bipolar transistor in a semiconductor body which includes forming the emitter of the transistor from a diffusion from a layer of polycrystalline silicon, which layer also serves as the gates of the MOS transistors. Also, the collector region is formed by an ion implantation step which can also form the source and drain of the MOS transistors.

The method of the present invention comprises forming along a surface of a semiconductor body of a first conductivity type a first layer of a second conductivity type opposite to that of the first conductivity. A first region of the second conductivity type is formed in a portion of the first layer. The conductivity of the first region is different than that of the first layer. A second layer of an insulating material is formed over the first layer and the first region. An aperture is formed in the insulating layer over a portion of the first region. A third layer of a conductive material is formed within the aperture and over the insulating second layer extending a short distance from the aperture. An exposed portion of the insulating second layer is then removed to expose a portion of the first layer. A dopant of a second conductivity type is embedded into the conductive third layer and the exposed portions of the first layer so as to form a second region of the first conductivity type around the first region. Annealing drives the dopant from the conductive third layer into the first region to form a third region of the second conductivity type within the first region. This forms a lateral bipolar transistor with the second region serving as a collector, the first region serving as a base, and the third region serving as an emitter.

The present invention is also directed to a lateral bipolar transistor which comprises a semiconductor body of a first conductivity type having along a surface thereof a first region of a second conductivity type opposite that of the first conductivity type. A second region of the second conductivity type, but of different conductivity than the first region, is in a portion of the first region. A layer of an insulating material is on the second region and has an aperture therethrough to a portion of the second region. A third region of the first conductivity type is in the first region and encircles the second region with the third region extending to the second region and at least to an outer edge of the insulating material layer. A fourth region of the first conductivity type is in the second region and under the aperture in the insulating material layer. Separate first level electrical contacts are on each of the first, third, and fourth regions.

The invention will be better understood from the following more detailed description taken with the accompanying drawings and claims.

BRIEF DESCRIPTION OF THE DRAWINGS

FIGS. 1 through 7 show cross-sectional views illustrating the results of the various steps of a method of making a lateral bipolar transistor in accordance with the present invention with FIG. 7 showing an essentially completed lateral bipolar transistor in accordance with the present invention.

Figure 4:
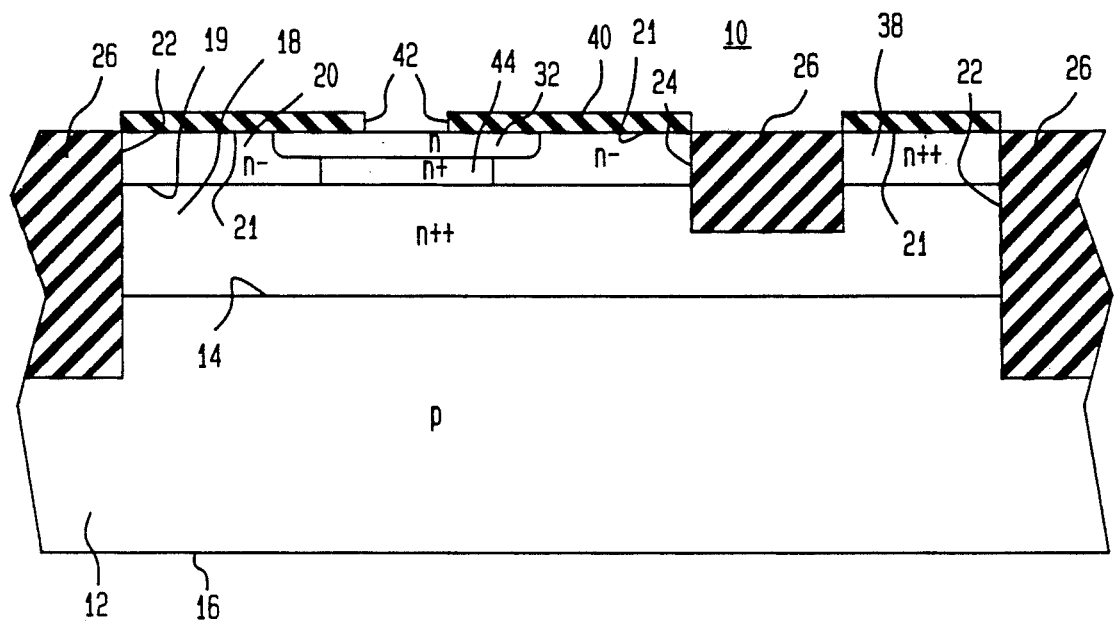

The drawings are not necessarily to scale.

DETAILED DESCRIPTION

Referring now to FIG. 1, there is shown a cross-sectional view of a semiconductor body 10 formed by the initial steps of a method in accordance with the present invention. The body 10 comprises a substrate 12 of a semiconductor material, such as single crystalline silicon, of one conductivity type, such as p-type conductivity, having a pair of opposed surfaces 14 and 16. The initial steps of the method in accordance with the present invention are to epitaxially deposit on the surface 14 a first layer 18 of single crystalline silicon. The first layer 18, which has a top surface 19, is of a second conductivity type opposite to that of the substrate 12 and of high conductivity, such as n++ type conductivity. A second layer 20, which has a top surface 21 and is of single crystalline silicon, is thinner than the first layer 18 and is epitaxially deposited on the first layer 18. The second layer 20 is of the same conductivity as the first layer 18, but of much lower conductivity, such as n− type conductivity. The first and second layers 18 and 20 may be denoted as a layer which comprises first and second sub-layers.

Spaced apart first and second trenches 22 are then formed through the second layer 20, first layer 18 and into the substrate 12. The trenches 22 are formed by providing a masking layer (not shown) such as of a photoresist, over the surface 21 of the second layer 20 with openings (apertures) in the masking layer where the trenches 22 are to be formed. The exposed areas of the second layer 20, first layer 18, and a portion of the substrate 12 are then removed by any well know etching technique, such as by an anisotropic etching. A third trench 24 is then formed through the second layer 20 and into the first layer 18 between the first and second trenches 22. The third trench 24 is separated from both trenches 22 and is closer to one of the trenches 22 than to the other so that the portion of the second layer 20 between the trenches 22 is divided into a small area 20a and a larger area 20b. The third trench 24 is typically formed in the same manner as the trenches 22. The first and second trenches 22 and the third trench 24 are then filled with an insulating material 26, such as silicon dioxide, using any well known deposition technique, such as chemical vapor deposition. In some applications, the first and second trenches 22 can be filled at a different time from the third trench 24.

Referring now to FIG. 2, there is shown a cross-sectional view of the body 10 after the next steps of the method in accordance with the present invention are completed. After the trenches 22 and 24 are filled with the insulating material 26, a masking layer 34 of a photoresist material is coated over the surface 21 and provided with an opening (aperture) 36 over the smaller area 20a of the second layer 20. The exposed smaller area 20a of the second layer 20 is then doped with an n−type conductivity dopant of an amount to form a highly conductive n−type conductivity (n++ type) region 38 completely through the smaller area 20a of the second layer 20 to the first layer 18. The highly conductive region 38 serves as a contact region to the first layer 18 which serves as a portion of the base of the transistor being formed. The doping of the smaller area 20a may be by diffusion or ion implantation. The masking layer 34 is then removed with a suitable solvent.

Referring now to FIG. 3, the novel process of the present invention continues with another masking layer 28, such as of a photoresist, being coated over the surface 21 and being provided with an opening (aperture) 30 therethrough over a portion of the larger area 20b of the second layer 20. The exposed portion of the larger area 20b of the second layer 20 is then doped with a dopant of n−type conductivity, such as arsenic or phosphorus, to form in a portion of the area 20b of the second layer 20, a region 32 which is of n−type conductivity and which serves as a portion of the base of the transistor being formed. The doping may be carried out by diffusion or by ion implantation. The masking layer 28 is then removed with a suitable solvent.

Referring now to FIG. 4, the novel process of the invention continues with a thin insulating layer 40 of silicon dioxide being then formed on the surface 21. This is achieved by heating the body 10 in an atmosphere containing oxygen so as to oxidize the exposed surface of the second layer 20 to silicon dioxide. The insulating layer 40 is of a thickness suitable for the gate oxide of an MOS transistor. An aperture 42 is formed in the insulating layer 40 over the base region 32 using standard photolithographic techniques. A high concentration of ions of an n−type conductivity dopant, such as phosphorus or arsenic, are implanted through the aperture 42 into the layer 20 between the base region 32 and the first layer 18. This forms a highly conductive n+type deep region 44 between the base region 32 and the layer 18. Region 44 serves with region 32, layer 14 and region 38 as the base of the transistor being formed. The body 10 is heated to activate the ion implantation. This causes the ions in the deep base region 44 to spread out laterally from their implanted positions and form a deep base region 44 which is wider than the aperture 42 in the insulating layer 40.

Figure 5:
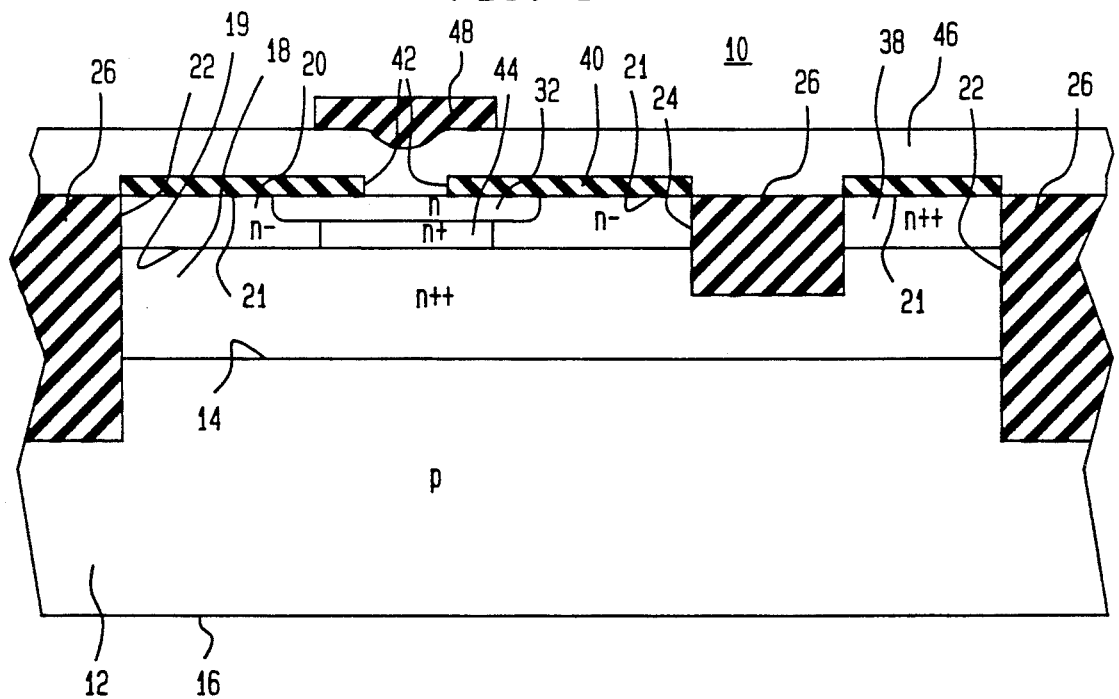

Referring now to FIG. 5, the novel process of the invention continues with a layer 46 of a conductive material, such as polycrystalline silicon, being deposited over the insulating layer 40 and within the aperture 42 so as to completely fill the aperture 42. This may be deposited by any well known technique, such as chemical vapor deposition. A masking material layer 48, such as of a photoresist, is coated over the conductive material layer 46. The masking material layer 48 is defined, using standard photolithographic techniques, to extend over the portion of the conductive material layer 46 which includes the aperture 42 and to extend a short distance from the aperture 42, but not beyond the edge of the base region 32. The masking layer 48 is in the form of a square, circle or similar shape so as to extend completely around the aperture 42.

Figure 6:
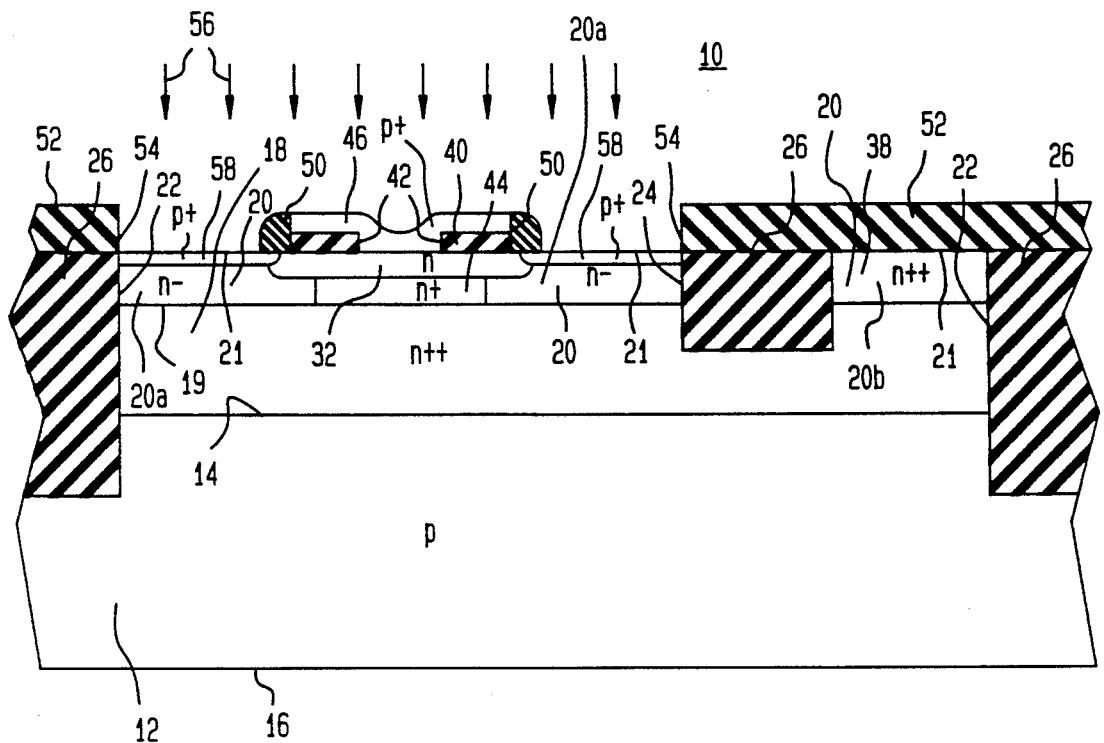

Referring now to FIG. 6, the novel process continues with the exposed portion of the conductive layer 46 being then removed with a suitable etchant. This leaves the conductive layer 46 only in the aperture 42 and extending a short distance over the insulating layer 40 from the aperture 42. This also exposes a portion of the insulating layer 40 around the conductive layer 46 which is then removed with a suitable etchant. The masking layer 48 is then removed with a suitable solvent. A sidewall spacer 50 of an insulating material, such as silicon dioxide, is then formed along the side edges of the conductive layer 46 and the insulating layer 40. This is achieved by the well known technique of depositing by chemical vapor deposition a layer of silicon dioxide (not shown) over the conductive layer 46 and the portions of the surface of the second layer 20 on each side of the conductive layer 46. The silicon dioxide layer is then etched with an anisotropic etch to remove the portions of the silicon dioxide layer which are over the conductive layer 46 and on the surface of the second layer 20. This leaves only portions of the silicon dioxide layer (sidewall spacers) 50 along the side edges of the conductive layer 46 and insulating layer 40.

A masking layer 52 of a photoresist is coated on the surface 21 and provided with an opening (aperture) 54 therethrough which exposes the portion of the second layer 20 between the left hand trench 22 and the trench 24. As indicated by the arrows 56 in FIG. 6, ions of the first conductivity type, such as boron ions of p-type conductivity, are then implanted into the conductive layer 46 and the exposed area of the second layer 20 around the conductive layer 46. This makes the conductive layer 46 highly conductive p-type (p+ type) and forms a highly conductive p-type conductivity region 58 in a portion of the area 20b of the second layer 20 which extends to the surface 21 and encircles the region 32. The p+ type region 58 serves as a collector of the lateral bipolar p-n-p transistor being formed.

Figure 7:
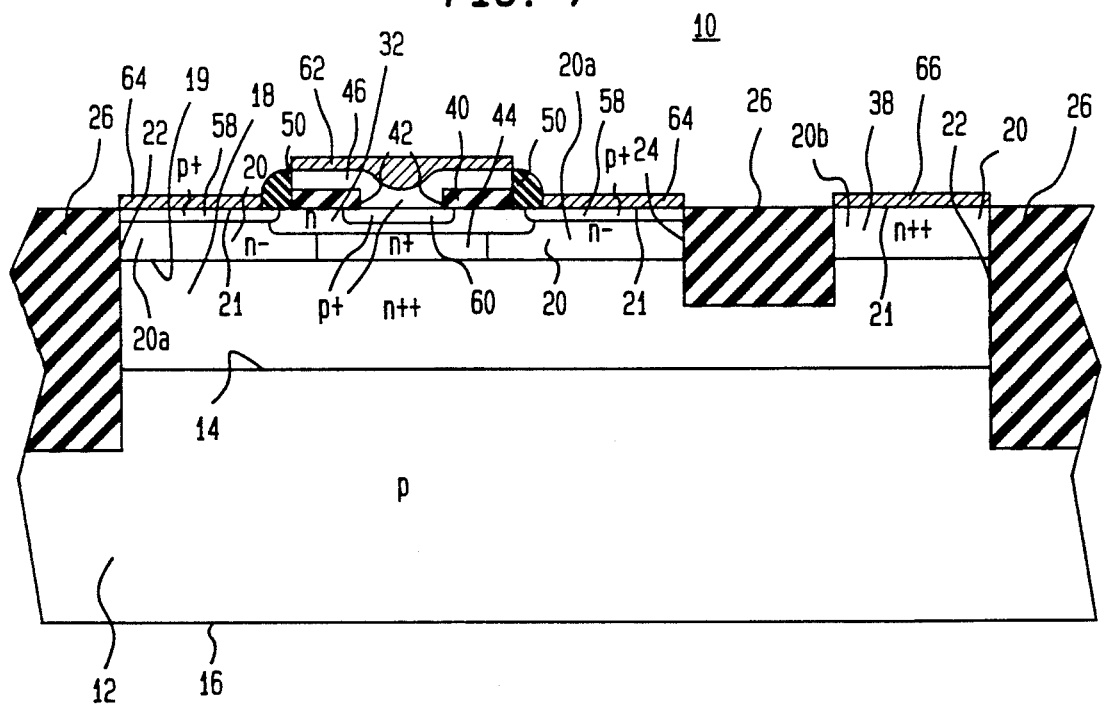

Referring now to FIG. 7, the novel process continues with the body 10 being heated to activate the implanted ions. This heating step also drives some of the p-type dopant from the conductive layer 46 into the base region 32 to form a heavily dope p-type conductivity region 60 (shown as p+) in the base region 32 directly under the conductive layer 46. The region 60 serves as an emitter of the bipolar transistor being formed. Regions 32, 44 and layer 18 serve as the base of the transistor with region 38 serving as a base contact region. Conductive contacts 62, 64 and 66 are then applied to the conductive layer 46, the surface of the collector region 58 and the surface of the base contact region 38, respectively. The conductive contacts 62, 64 and 66 may be of a metal or a metal silicide. The conductive contacts 62, 64 and 66 may applied by coating a metal layer over the device and defining it to form the various contacts or by any well known silicide process.

The resulting structure shown in FIG. 7 is a lateral p-n-p transistor. In a typical lateral p-n-p transistor as shown in FIG. 7, the substrate 12 is about 1000 microns thick and has an impurity concentration of about $10^{15}$ impurities/cm$^3$, the layer 18 is about 2 microns thick and has an impurity concentration of about $10^{20}$ impurities/cm$^3$, the layer 20 is about 0.3 microns thick and has an impurity concentration of about $5 \times 10^{15}$ to $5 \times 10^{17}$ impurities/cm$^3$, the region 58 is about 0.2 microns thick and has an impurity concentration of about $10^{20}$ impurities/cm$^3$, the region 60 is about 0.05 microns thick and has an impurity concentration of about $10^{20}$ impurities/cm$^3$, the polycrystalline (polysilicon) region 46 is about 0.3 micron thick and has an impurity concentration of about $10^{20}$ impurities/cm$^3$, the region 38 is about 0.5 micron thick and has an impurity concentration of about $10^{20}$ impurities/cm$^3$, the region 32 is about 0.3 micron thick and has an impurity concentration of about $5 \times 10^{18}$ impurities/cm$^3$, and the region 44 has an impurity concentration of about $5 \times 10^{18}$ to $10^{20}$ impurities/cm$^3$. The width of region 60 is about 1 micron; the width of region 32 on each side of region 60 is 0.4 to 2 microns; the width of region 58 is about 1 micron on each side of region 32; and the width of region 38 is about 1 micron.

The lateral bipolar transistor in accordance with the present invention has only a single level (first-level) of metallization which includes the polycrystalline layer 46 and its contact 62 forming the emitter contact, the collector contact 64 and the base contact 66. This single level metallization reduces the thickness of the surface topography and is compatible with the metallization process for making MOS transistors so as to make the lateral bipolar transistor useful in making BICMOS integrated circuits.

In the lateral bipolar transistor in accordance with the present invention, the spacing along the surface of the base region 32 between the emitter region 60 and collector region 58 is controlled by the formation of openings in the uniformly thick insulating layer 40. This spacing is controlled by the spacing between the opening 42, which defines the emitter region 60 and the etching of the polycrystalline silicon layer 46 and the insulating layer 40, which defines the position of the collector region 58. This spacing can be varied over a wide range so as to permit the formation of a lateral bipolar transistor having a desired beta over a wide range of values. Although the lateral bipolar transistor is shown as having a sidewall spacer 50, this does not control the beta of the transistor and can even be eliminated, if desired. It is only shown since it is automatically provided in a BICMOS process since such sidewall spacers are used in forming the MOS transistors.

Also, in the lateral bipolar transistor in accordance with the present invention, the n+ type region 44 between the base region 32 and the buried base region 18 suppresses the injection of holes into the base region. This suppresses undesired vertical flow of electrons and increases the desired lateral flow. This reduces the base current, base resistance, the stored charge in the base layers, and the parasitic p-n-p isolation current (associated with a parasitic vertical p-n-p transistor having regions 46 and 60 serving as the emitter, regions 32, 38 and 44 and layers 20 and 18 serving as the base, and substrate 12 serving as the collector).

Thus, there is provided a lateral bipolar transistor and method of making a lateral bipolar transistor in a body 10 of a semiconductor material. A number of the steps of the method in accordance with the present invention are the same steps used to make a MOS transistor. For example, when making the trenches 22 for defining the area of the body 10 in which the lateral bipolar is formed, additional trenches 22 can be formed to define the areas of the body 10 in which MOS transistors of a CMOS circuit are to be formed. The thin insulating layer 40 is formed over the entire surface of the second layer 20 and serves as the gate oxide layer for the various MOS transistors as well as a masking layer to define the emitter region of the lateral bipolar transistor. The conductive layer 46 is applied over the entire insulating layer 40 and is defined to form the gates of the MOS transistors as well as the source of the dopant for forming the emitter region 60 and as the contact to the emitter region 60 of the lateral bipolar transistor. The implant used to form the collector region 58 is also used to form the source and drain regions of a MOS transistor having the same conductivity type as the collector region 58. Also, the step or steps of forming the contact 62, 64 and 66 are used to form the contacts to the source, drain and gate of the MOS transistors. Thus, with only a few additional steps the lateral bipolar transistor can be made as part of a standard method of making MOS transistors so as to permit the making of a BICMOS circuit.

It is to be appreciated and understood that the specific embodiments of the invention are merely illustrative of the general principals of the invention. Various modifications may be made consistent with the principles set forth. For example, the conductivity types of the layers and regions can be reversed to form a lateral n-p-n bipolar transistor rather than the lateral p-n-p bipolar transistor shown and described.

What is claimed is:

1. A method of making a lateral bipolar transistor comprising the steps of:
   forming along one surface of a semiconductor body of a first conductivity type a first layer of a second conductivity type opposite the first conductivity type;
   forming in a portion of the first layer a first region of the second conductivity type but of a conductivity different from that of the first layer;
   forming a second layer of an insulating material over the first layer and the first region;
   forming an aperture in a portion of the insulating second layer over the first region;
   forming a third layer of a conductive material within the aperture and over a portion of the insulating second layer and extending a short distance from the aperture so as to leave exposed a portion of the insulating second layer around the conductive third layer;
   removing the exposed portion of the insulating second layer around the conductive third layer to expose a portion of the first layer;
   embedding a dopant of the first conductivity type into the conductive third layer and the exposed portion of the first layer so as to form a second region of the first conductivity type around the first region; and
   annealing so as to drive the dopant from the conductive third layer into the first region to form a third region of the first conductivity type within the first region with the third region serving as an emitter of a lateral bipolar transistor which is surrounded by the first region which serves as a base and the second region which serves as a collector.

2. The method of claim 1 wherein:
   the first layer comprises first and second sub-layers with the second sub-layer being formed on the surface of the semiconductor body;
   the second sub-layer being formed on the first sub-layer and the third region being formed in a portion of the first sub-layer; and
   the third region being of intermediate conductivity between the first and second sub-layers with the first sub-layer having the highest conductivity.

3. The method of claim 2 further comprising the steps of:
   forming an insulating region through the second sub-layer and into the first sub-layer so as to divide the second sub-layer into two parts;
   forming the first region in one of the parts of the second sub-layer; and
   increasing the conductivity of the other part of the second sub-layer so as to convert at least a portion of the other part of the second sub-layer to a contact region which contacts the first sub-layer.

4. The method of claim 3 further comprising the step of implanting, prior to forming the conductive third layer in the aperture in the insulating second layer, a dopant of the second conductivity type through the aperture into a portion of the second sub-layer between the first region and the first sub-layer to form between the first region and the first sub-layer a fourth region of the second conductivity type and of a conductivity higher than that of the first region.

5. The method of claim 4 in which the conductive third layer is a layer of polycrystalline silicon deposited over the insulating second layer and in the aperture, and further comprising the step of defining the polycrystalline silicon layer to provide a portion in the aperture and extending a short distance over the insulating second layer beyond the aperture.

6. The method of claim 5 further comprising the step of forming separate electrical contacts to the polycrystalline silicon layer, the collector second region and to the contact region.

7. The method of claim 6 wherein the first and second conductivity types are p-type and n−type, respectively.

8. A method of making a lateral bipolar transistor comprising the steps of:
   depositing on a surface of a semiconductor body of a first conductivity type a semiconductor layer of a second conductivity type opposite that of the first type;
   forming in the semiconductor layer a first region of the second conductivity type;
   forming an insulating layer on the semiconductor layer and the first region;
   forming an aperture through the insulating layer over a portion of the first region;
   depositing a conductive layer over said insulating layer and in said aperture;
   defining said conductive layer to leave a portion thereof in said aperture and extending over said first region a short distance beyond the aperture but not beyond the edge of the first region so as to expose a portion of the insulating layer beyond the defined portion of the conductive layer;
   removing the exposed portion of the insulating layer to expose a portion of the first region;
   implanting a dopant of the second conductivity type into the defined portion of the conductive layer and the exposed portion of the semiconductor layer to form a second region of second conductivity type around the first region; and
   annealing to drive the dopant from the conductive layer into the first region through the aperture in the insulating layer to form a third region of the second conductivity type within the first region and separated by portions of the first region from the second region.

9. The method of claim 8 wherein the semiconductor layer comprises a first sub-layer of a highly conductive semiconductor material of the second conductivity type deposited on the surface of the semiconductor body and a second sub-layer of a semiconductor material of the second conductivity type, but of lower conductivity than the first sub-layer, deposited on the first sub-layer, and the first region is formed in the second sub-layer and is of a conductivity higher than that of the second sub-layer but lower than that of the first sub-layer.

10. The method of claim 9 further comprising the step of forming an insulating region through the second sub-layer and into the first sub-layer so as to divide the second sub-layer into first and second portions with the second portion being a smaller area than the first portion, and wherein the first region is formed in the first portion of the second sub-layer.

11. The method of claim 10 further comprising the step of increasing the conductivity of at least a portion of the second portion of the second sub-layer so as to form a contact region to the first sub-layer.

12. The method of claim 11 further comprising the step of implanting, prior to forming the layer of conductive material in the aperture in the insulating layer, a dopant of the second conductivity type through the first region and into a portion of the second sub-layer between the first region and the first sub-layer so as to form a region of the second conductivity type, but of a conductivity higher than that of the second sub-layer, between the first region and the first sub-layer.

13. The method of claim 12 in which the conductive layer is a layer of polycrystalline silicon deposited on the insulating layer and in the aperture.

14. The method of claim 13 further comprising the step of forming, after the exposed area of the insulating layer is removed, but before implanting the dopant of the second conductivity type, sidewall spacers along the side edges of the conductive layer and the insulating layer.

15. The method of claim 14 further comprising the step of depositing separate electrical contacts on the defined conductive layer, the second region, and the contact region.

16. The method of claim 8 in which the first conductivity type is p-type and the second conductivity type is n−type.

17. A method of making a lateral p-n-p transistor comprising the steps of:
forming on one surface of a semiconductor body of p-type conductivity a first layer of n++ type conductivity;
forming on one surface of the first layer a second layer of n−type conductivity but of lower impurity concentration than the first layer;
forming separated first and second trenches through the first and second layers and into a portion of the semiconductor body;
forming a third trench between the first and second trenches with the third trench being separated from the first and second trenches by portions of the first and second layers and extending though the first layer into the second layer;
filling the first, second and third trenches with an insulating material;
forming a first masking layer having an aperture therein over the second layer such that a first portion of the second layer localized between the third trench and the first trench is exposed;
implanting ions into the exposed first portion of the second layer to increase the impurity concentration in the exposed portion of the second layer down to the first layer;
removing the first masking layer;
forming a second masking layer having an aperture therein over the second layer such that a second portion of the second layer localized between the second and third trenches is exposed;
implanting ions into the exposed second portion of the second layer to increase the impurity concentration in the exposed second portion of the second layer;
removing the second masking layer and forming a silicon dioxide layer over the first and second portions of the second layer;
forming an aperture in the silicon dioxide layer over a part of the second portion of the second layer;
implanting ions into a third portion of the second layer which is located between the second portion of the second layer and the first layer so as to increase the impurity concentration of the third portion;
forming a polycrystalline layer over the silicon dioxide layer;
removing a portion of the polycrystalline layer except over the aperture in the silicon dioxide layer and a portion there adjacent which has a lessor lateral extent than the second portion of the second layer therebelow;
forming on exposed surfaces of the polycrystalline layer sidewall spacers;
forming a third masking layer over the exposed portions of the second layer, the remaining polycrystalline layer and the sidewall spacers;
forming an aperture in the third masking layer which exposes the portion of the second layer between the first and third trenches, the sidewall spacers and the remaining portion of the polycrystalline;
implanting p-type ions through the aperture in the third masking layer so as to convert a fourth portion of the exposed second layer to p+ type conductivity and to dope the remaining portion of the polycrystalline layer p+ type conductivity and to convert a fifth portion of the second layer under the remaining portion of the polysilicon layer to p+ type conductivity; and
forming separate first level conductive electrical contacts to the first and fourth portions of the second layer and to the remaining portion of the polycrystalline layer.

18. A method of making a lateral p-n-p transistor comprising the steps of:
depositing on a surface of a semiconductor body of p-type conductivity a first layer of semiconductor material of n++ type conductivity;
depositing on the first layer a second layer of a semiconductor material of n− type conductivity;
forming first and second spaced apart trenches through the first and second layers and into the semiconductor body;
forming a third trench through the second layer into the first layer, the third trench being located between the first and second trenches and dividing the second layer into a first portion and a second portion which is smaller than the first portion;
doping the second portion of the second layer with an n−type conductivity impurity to form an n++ type conductivity region extending through the second portion of the second layer to the first layer;
doping a portion of the first portion of the second layer with an n−type conductivity impurity to form an n−type conductivity region in the first portion of the first layer;

forming an aperture in the insulating material over a portion of the n−type conductivity region to expose a portion of the n−type conductivity region;

implanting ions of n−type conductivity impurity into the first layer through the aperture in the insulating layer to form an n+ type conductivity region in the first layer between the n−type region and the first layer;

forming a masking layer over the portion of the polycrystalline silicon layer which is within the aperture in the insulating layer and a portion of the polycrystalline silicon layer which extends a short distance beyond the aperture in the insulating layer;

depositing a layer of polycrystalline silicon on the exposed portion of the n−type region in the aperture in the insulating layer and over the insulating layer;

removing the polycrystalline silicon layer not covered by the mask layer to expose the insulating layer under the removed portion;

removing the exposed portion of the insulating layer to expose a portion of the second layer under the removed layer;

implanting ions of a p−type conductivity impurity into the polycrystalline silicon layer and into the exposed portion of the second layer to form a p-type conductivity region in the second layer around the n−type region;

annealing to drive the p-type impurities from the polycrystalline silicon layer into the n−type so as to form a p-type region in a portion thereof under the aperture in the insulating layer; and forming a layer of electrically conductive material containing a metal and patterning same so as to form separate first-level electrical contacts on the p-type region in the second layer, on the polycrystalline silicon layer, and on the n++ type region.

* * * * *